United States Patent [19]

Shacter

[11] Patent Number: 5,847,606
[45] Date of Patent: Dec. 8, 1998

[54] LOW VOLTAGE CMOS AMPLIFIER OUTPUT STAGE

[75] Inventor: Stuart Barnett Shacter, Tucson, Ariz.

[73] Assignee: National Semiconductor Corporation, Santa Clara, Calif.

[21] Appl. No.: 851,148

[22] Filed: May 5, 1997

[51] Int. Cl.[6] ........................................................ H03F 3/45

[52] U.S. Cl. ............................................ 330/253; 330/255

[58] Field of Search .................................... 330/253, 255, 330/264

[56] References Cited

U.S. PATENT DOCUMENTS

5,039,953  8/1991  Su ........................................ 330/255 X

Primary Examiner—James B. Mullins
Attorney, Agent, or Firm—Limbach & Limbach L.L.P.

[57] ABSTRACT

A CMOS amplifier output stage including a complementary output MOSFET transistor pair whose channels are connected together in series between a supply voltage and a reference potential, and whose gates are driven by a complementary MOSFET level shifting transistor pair and by bias voltage and current circuitry. Preferably, the level shifting transistor pair is a diode-connected NMOS transistor and a diode-connected PMOS transistor, the bias circuitry includes a source follower which drives the source of one of the diode-connected transistors with a current determined by an input voltage, all active elements of the invention are MOSFET transistors, and the minimum supply voltage required for operation is $(V_{GS}+2V_{SAT})$, where $V_{GS}$ is the largest source to gate voltage of the MOSFET transistors and $V_{SAT}$ is the largest source to drain voltage of the MOSFET transistors during operation in the saturation region. This allows operation with a supply voltage as low as 1.8 volts with MOSFET transistors suitable for typical applications. The quiescent output current is well controlled and is determined by the device sizes of the MOSFET transistors. The invention can be implemented as part of a standard cell amplifier for any of a variety of mixed analog/digital circuits, even using high density, low voltage processes.

21 Claims, 4 Drawing Sheets

LOW VOLTAGE CMOS AMPLIFIER OUTPUT STAGE

BACKGROUND OF THE INVENTION

1. Field of the Invention

The invention pertains to amplifiers implemented as integrated circuits (or portions of integrated circuits) using CMOS (complementary metal oxide semiconductor) technology. More specifically, one aspect of the invention is an amplifier output stage implemented (using CMOS technology) as a portion of an integrated circuit which is capable of operating with a low supply voltage (e.g., less than 2.2 volts, and preferably as low as 1.8 volts or less). Another aspect of the invention is an amplifier implemented as an integrated circuit (or portion of an integrated circuits) which includes such an output stage.

2. Description of the Related Art

It is well known to implement CMOS amplifiers as integrated circuits (or portions of integrated circuits) which comprise pairs of PMOS (P-channel MOSFET) and NMOS (N-channel MOSFET) transistors. Typically, the output stages of such amplifiers comprise complementary pairs of PMOS and NMOS transistors, and are designed to maintain an output pin (coupled to an external device) at a desired output voltage, while the external device sinks current (whose magnitude is any of a broad range of values) from the pin or sources current (whose magnitude is any of a broad range of values) to the pin. However, each such conventional output stage has either required a high supply voltage (more than 2.2 volts above ground) to operate, or has had a complicated design comprising a large number of transistors (e.g., more than twenty transistors) and has drawn a large supply current during operation.

Figure 1:
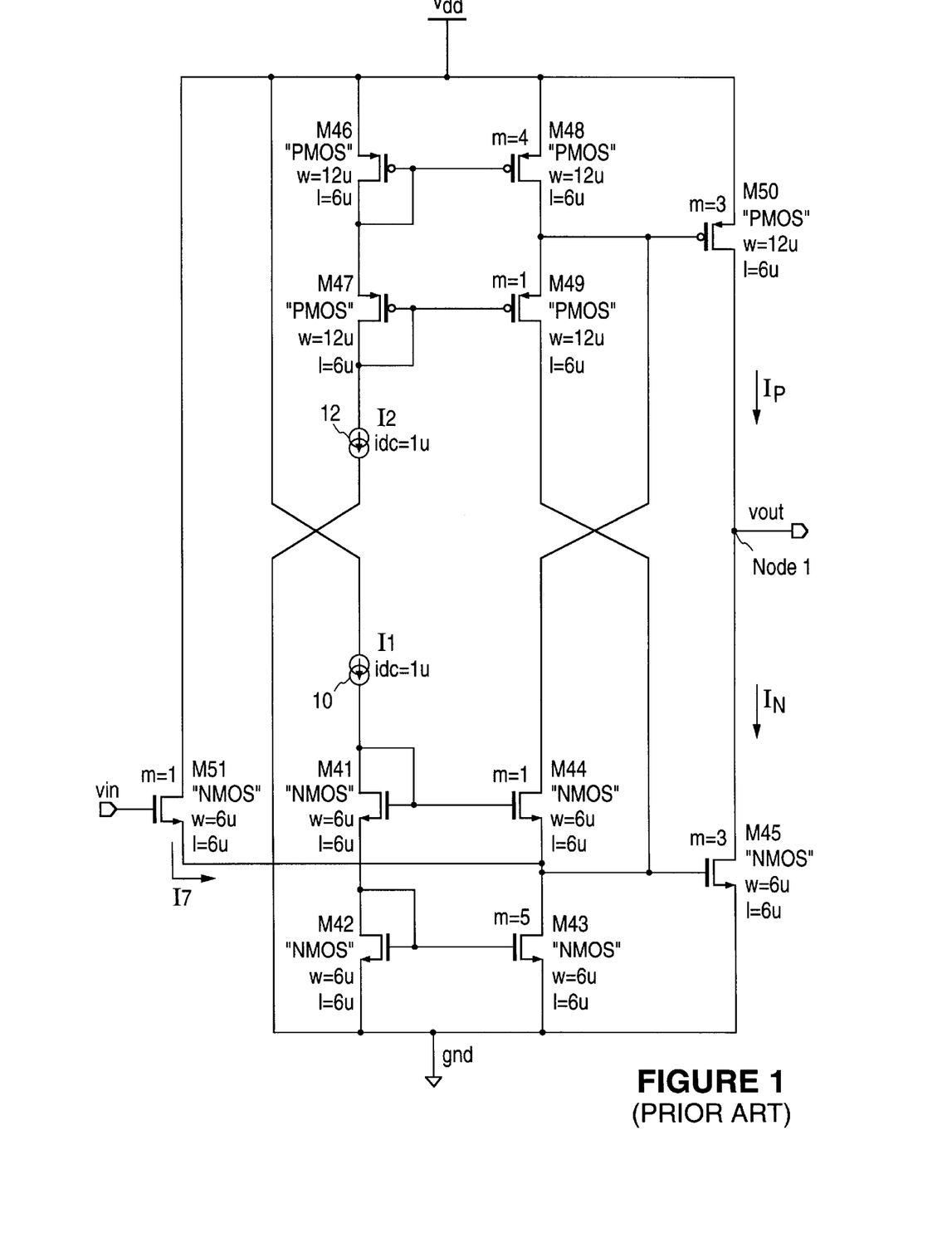
FIG. 1 is a schematic diagram of a conventional CMOS amplifier output stage.

For example, U.S. Pat. No. 4,570,128, issued Feb. 11, 1986, describes an amplifier implemented using CMOS technology as an integrated circuit, whose output stage requires a high supply voltage to operate. FIG. 1 is a diagram of an CMOS amplifier output stage of the type described in U.S. Pat. No. 4,570,128. The FIG. 1 circuit includes NMOS transistors M41–M45, PMOS transistors M46–M50, bias current sources 10 and 12, and NMOS source follower transistor M51 connected as shown. In response to a change in input voltage Vin (asserted at the gate of source follower transistor M51) which increases current I7 (assuming that an adequate supply voltage Vdd is asserted to the drain of transistor M51 and the sources of transistors M46, M48, and M50), the voltage at the gate of NMOS output transistor M45 increases so that more output current $I_N$ can flow through the channel of transistor M45, and the voltage at the gate of PMOS output transistor M50 increases so that less output current $I_P$ can flow through the channel of transistor M50. Thus, the output voltage Vout at Node 1 falls and the FIG. 1 circuit can sink more current from Node 1. In response to a change in input voltage Vin at the gate of NMOS transistor M51 which decreases current I7 (also provided that an adequate supply voltage Vdd is asserted to the drain of transistor M51 and to the sources of transistors M46, M48, and M50), the voltage at the gate of NMOS output transistor M45 decreases so that less output current $I_N$ can flow through the channel of transistor M45, and the voltage at the gate of transistor M50 decreases so that more output current $I_P$ can flow through the channel of transistor M50. Thus, output voltage Vout at Node 1 rises and the FIG. 1 circuit can source more current to Node 1. Current source 12 sinks a bias current I2 selected so that the gate of transistor M49 is biased at a desired level, and current source 10 is a source of bias current I1 selected so that the gate of transistor M44 is biased at a desired level. For the FIG. 1 circuit to operate as intended, supply voltage Vdd must be at least $((2V_{GS})+V_{SAT})$, where $V_{GS}$ is the voltage drop from the source to gate of each of transistors M46–M50 (the voltage drop from the gate to source of each of transistors M41–M45) and $V_{SAT}$ is the voltage drop from the source to the drain of each of transistors M46–M50 (the voltage drop from the drain to the source of each of transistors M41–M45) during operation. With transistors M41–M51 having typical characteristics (including channel widths and lengths as indicated in FIG. 1), supply voltage Vdd must be at least 2.2 volts.

It would be desirable to implement an amplifier output stage using CMOS technology with a simple design (comprising only a few MOSFET transistors), so that the output stage draws low supply current, and is capable of operating with a lower supply voltage than the minimum supply voltage of the conventional circuit of FIG. 1 (e.g., less than 2.2 volts, and preferably as low as 1.8 volts or less).

However, until the present invention, CMOS amplifier output stages designed to operate with such a low supply voltage have had a complicated design (comprising more than twenty MOSFET transistors) and have drawn large supply currents, or have used various mirror schemes to control the output current which has resulted in a large difference between the gain of each when sinking current and when sourcing current (and in increased difficulty in compensating each such output stage for frequency response).

SUMMARY OF THE INVENTION

The CMOS amplifier output stage of the invention produces an output voltage in response to an input voltage, and includes a complementary output MOSFET transistor pair whose channels are connected together in series (and having channel terminals for connection between a supply voltage source and reference potential which is typically ground potential), and whose gates are driven by a complementary MOSFET level shifting transistor pair and by bias voltage and current circuitry. The bias voltage and current circuitry is connected to the level shifting transistor pair and to the gates of the complementary output MOSFET transistor pair, and receives the input voltage. Preferably, the level shifting transistor pair consists of a diode-connected NMOS transistor and a diode-connected PMOS transistor, and the bias voltage and current circuitry includes a source follower transistor which drives the source of one of the diode-connected transistors with a current determined by the input voltage.

Preferably also, all active elements of the inventive output stage are MOSFET transistors (the output stage is implemented entirely by MOSFET transistors and optionally also one or more capacitors), and the minimum supply voltage required for operation of the output stage is $(V_{GS}+2V_{SAT})$, where $V_{GS}$ is the largest source to gate voltage of the MOSFET transistors during operation and $V_{SAT}$ is the largest source to drain voltage of the MOSFET transistors during operation. This allows operation with a supply voltage as low as 1.8 volts (with MOSFET transistors of types suitable for typical applications).

Since only core MOSFET devices are needed to implement the inventive output stage, it can be implemented as part of a standard cell amplifier for any of a variety of mixed analog/digital circuits, even using high density, low voltage processes.

When the inventive output stage produces the output voltage at an output node to which an external circuit (or device) is coupled, the output stage can maintain the output node (which is typically an external pin of an integrated circuit) at a desired output voltage (in the range between the supply voltage and ground potential) while the external circuit (or device) sinks current (whose magnitude is any of a broad range of values) from the output node or sources current (whose magnitude is any of a broad range of values) to the output node.

The output quiescent current of the inventive output stage is well controlled, and is determined by the device sizes of the MOSFET transistors comprising the output stage.

DETAILED DESCRIPTION OF PREFERRED EMBODIMENTS

Figure 2:
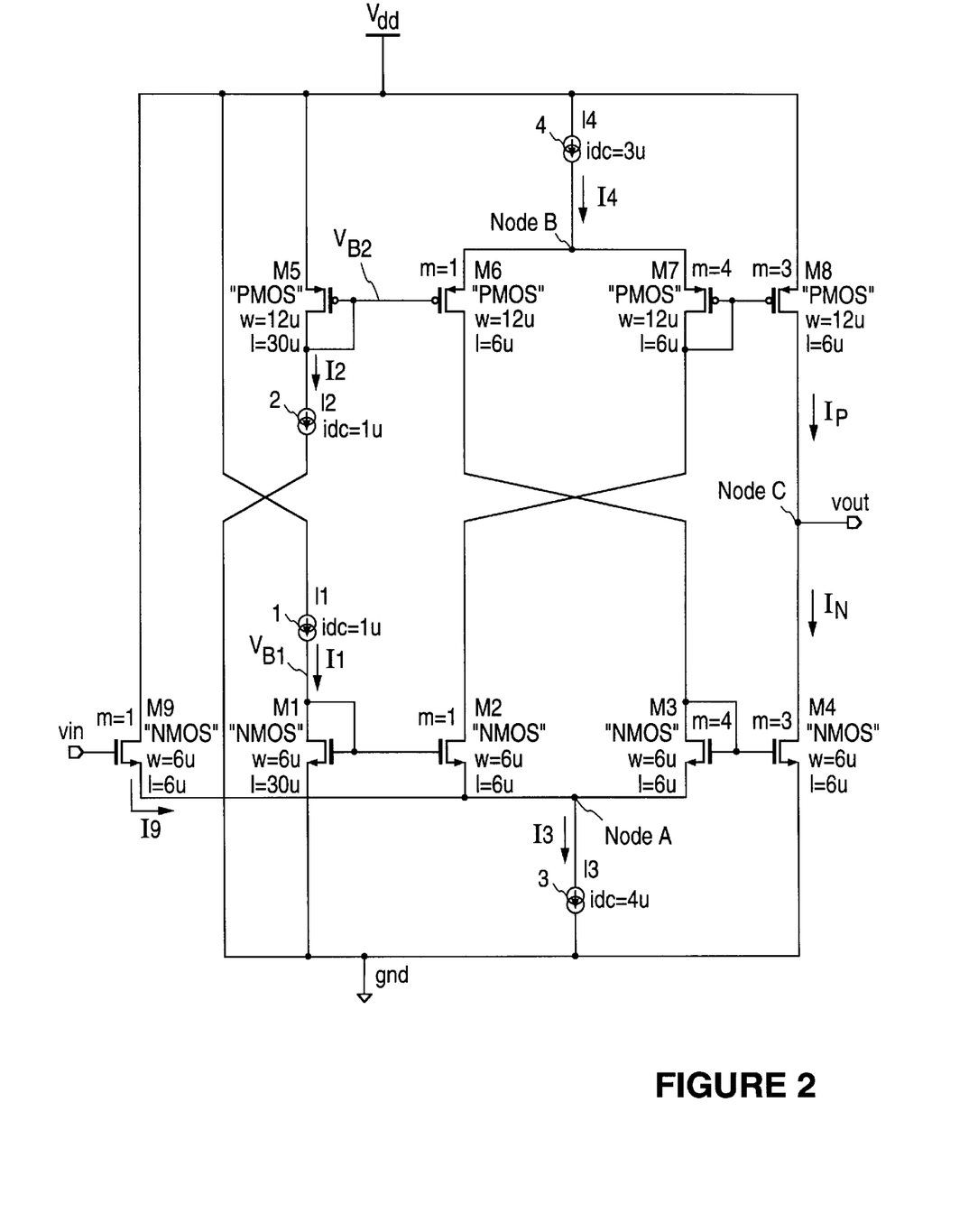
FIG. 2 is a schematic diagram of a preferred embodiment of the CMOS amplifier output stage of the invention (with an NMOS source follower driving node A thereof).

The circuit of FIG. 2 is a preferred embodiment of the CMOS amplifier output stage of the invention. The FIG. 2 circuit includes NMOS transistors M1–M4, PMOS transistors M5–M8, bias current sources 1, 2, 3, and 4, and source follower NMOS transistor M9 connected as shown. Depending on the input voltage Vin at the gate of source follower transistor M9, input current I9 flows from the source of transistor M9 to node A. Current source 2 sinks a bias current I2 selected so that the gate of PMOS transistor M6 is biased at a desired voltage level, and current source 1 is a source of bias current I1 selected so that the gate of NMOS transistor M2 is biased at a desired voltage level. Current source 3 sinks a bias current I3 from node A, and current source 4 is a source of bias current I4 to node B. Ideally, the FIG. 2 circuit is balanced when bias current I3 equals bias current I4 (but typically, the selected values of currents I3 and I4 will differ by an amount adequate to properly bias source follower M9). However, in actual implementations, bias currents I3 and I4 typically differ by a small amount appropriate to bias the source follower (M9 in FIG. 2, or M10 in FIG. 3 to be described below) which receives the input voltage.

In a particular implementation of the FIG. 2 circuit for drawing low supply current (less than 10 microamps) during operation, each of currents I1 and I2 is one microamp, current I3 is 4 microamps, current I4 is 3 microamps, the channel width and length of transistor M1 are 6 microns and 30 microns, respectively, the channel width and length of each of transistors M2 and M9 are 6 microns and 6 microns, respectively, the channel width and length of transistor M3 are 24 microns and 6 microns, the channel width and length of transistor M4 are 18 microns and 6 microns, respectively, the channel width and length of transistor M5 are 12 microns and 30 microns, respectively, the channel width and length of transistor M6 are 12 microns and 6 microns, respectively, the channel width and length of transistor M7 are 48 microns and 6 microns, respectively, and the channel width and length of transistor M8 are 36 microns and 6 microns, respectively (as indicated in FIG. 2). In this implementation, supply voltage Vdd is 1.8 volts above ground potential. Other implementations of the FIG. 2 circuit will have different values of these circuit parameters, and variations on the specific circuit design shown in FIG. 2 are within the scope of the invention.

In the quiescent state of the FIG. 2 circuit (when I9 is equal to I3-I4), the drain and gate of diode-connected NMOS transistor M1 are at bias voltage $V_{B1}$ above ground (where $V_{B1}$ is equal to $V_{GS1}$, the voltage drop from the gate to the source of transistor M1), and the gate of NMOS output transistor M4 (which determines the current $I_N$ through the channel of transistor M4) is at voltage $V_{B1}-V_{GS2}+V_{GS3}$, where $V_{GS2}$ is the voltage drop from the gate to the source of transistor M2 and $V_{GS3}$ is the voltage drop from the gate to the source of transistor M3. Thus, current $I_N$ is determined by the device sizes of NMOS transistors M1, M2, M3, and M4 and the drain currents of M1, M2, and M3. Also in the quiescent state of the FIG. 2 circuit, the drain and gate of diode-connected PMOS transistor M5 are at bias voltage $V_{B2}$ below Vdd (where $V_{B2}$ is equal to $V_{GS5}$, the voltage drop from the source to the gate of transistor M5), and the gate of PMOS output transistor M8 (which determines the current $I_P$ through the channel of transistor M8) is at voltage $V_{B2}+V_{GS6}-V_{GS7}$, where $V_{GS6}$ is the voltage drop from the source to the gate of transistor M6 and $V_{GS7}$ is the voltage drop from the source to the gate of transistor M7. Thus, current $I_P$ is determined by the device sizes of PMOS transistors M5, M6, M7, and M8 and the source currents of M5, M6, and M7. Typically, current sources 1, 2, 3, and 4 are implemented using only MOSFET transistors (e.g., in the manner to be described with reference to FIG. 4). Since the drain currents of M1, M2, and M3 and the source currents of M5, M6, and M7 are well controlled by current sources 1, 2, 3, and 4, the output quiescent current $(I_P-I_N)$ at node C is also well controlled (and is determined by the device sizes of transistors M1–M8 and of the MOSFET transistors comprising current sources 1–4).

We next describe the manner in which the FIG. 2 circuit (in its quiescent state) responds to changes in input voltage Vin at the gate of source follower transistor M9, assuming that a sufficiently high supply voltage Vdd is asserted to the drain of transistor M9 and the sources of transistors M5 and M8. For the FIG. 2 circuit to operate as intended, supply voltage Vdd must be at least $(V_{GS}+2(V_{SAT}))$, where $V_{GS}$ is the voltage drop from the source to gate of each of transistors M6 and M8 (which is at least substantially equal to the voltage drop from the gate to source of each of transistors M4 and M2) and $V_{SAT}$ is the voltage drop from the source to the drain of each of transistors M5–M8 (which is at least substantially equal to the voltage drop from the drain to the source of each of transistors M1–M4) during operation. To appreciate this, consider the path from the source of supply voltage Vdd to ground through transistors M8, M2, M3, and M4. The voltage drop along this path is $V_{GS8}+V_{DS2}-V_{GS3}+V_{GS4}$, where $V_{GS8}$ is the voltage drop from the source to the gate of transistor M8, $V_{DS2}$ is the voltage drop from the drain to the source of transistor M2, $V_{GS3}$ is the voltage drop from the gate to the source of transistor M3, and $V_{GS4}$ is the voltage drop from the gate to the source of transistor M4. In operation, the drain to source voltage of each of NMOS transistors M1–M4 and the source to drain voltage of each of PMOS transistors M5–M8 is substantially equal to a value $V_{SAT}$ and the difference $V_{GS4}-V_{GS3}$ is also substantially equal to $V_{SAT}$. Since the value $V_{SAT}$ is significantly less than $V_{GS}$ (the source to the gate voltage drop of each of transistors M5–M8, or the gate to source voltage drop of each of transistors M1–M4), the minimum supply voltage Vdd needed for operation of the FIG. 2 circuit is significantly less than that needed for operation of the conventional FIG. 1 circuit. With transistors M1–M8 (and those comprising current sources 1–4) having characteristics suitable for typical applications (e.g., the channel widths and lengths indicated in FIG. 2), supply voltage Vdd can be as low as 1.8 volts (in contrast with the minimum supply voltage of 2.2 volts need for operation of typical implementations of the FIG. 1 circuit).

In general, the inventive output stage is preferably implemented entirely by MOSFET transistors (and optionally also one or more capacitors), and the minimum supply voltage required for operation of the output stage is $(V_{GS}+2V_{SAT})$, where $V_{GS}$ is the largest source to gate voltage drop of the MOSFET transistors during operation and $V_{SAT}$ is the largest source to drain voltage drop of the MOSFET transistors during operation.

With reference again to the FIG. 2 embodiment, in response to a change in input voltage Vin which increases current I9, the voltage at node A increases and thus the voltage at the gate of NMOS output transistor M4 increases. Thus, more output current $I_N$ can flow through the channel of transistor M4. Also, transistor M2 turns off (if the voltage increase at Node A is sufficiently great) and the voltage at the gate of PMOS output transistor M8 increases so that less output current $I_P$ can flow through the channel of transistor M8. Thus, the output voltage Vout at Node C falls and the FIG. 2 circuit can sink more output current from Node C (e.g., from an external circuit or device coupled to Node C).

In response to a change in input voltage Vin which decreases current I9, the voltage at node A falls and thus the voltage at the gate of NMOS output transistor M4 decreases. Thus, less current $I_N$ can flow through the channel of transistor M4. Also, transistor M2 turns on harder and the voltage at the gate of PMOS output transistor M8 decreases so that more current $I_P$ can flow through the channel of transistor M8. Thus, the output voltage Vout at Node C rises and the FIG. 2 circuit can source more output current to Node C (e.g., to an external circuit or device coupled to Node C).

Thus, the output stage of FIG. 2 produces an output voltage Vout at Node C in response to an input voltage Vin at the gate of source follower M9, and includes a complementary output MOSFET transistor pair (transistors M4 and M8) whose channels are connected together in series with channel terminals connected between a supply voltage and a reference potential (ground potential), and whose gates are driven by a complementary MOSFET level shifting transistor pair (diode-connected NMOS transistor M3 and diode-connected PMOS transistor M7) and bias voltage and current circuitry (comprising transistors M1, M2, M5, M6, and M9, and current sources 1, 2, 3, and 4). Source follower transistor M9 drives the source of diode-connected transistor M3 with current I9 (which current is determined by input voltage Vin as well as by the supply voltage and the characteristics of transistor M9).

Figure 3:
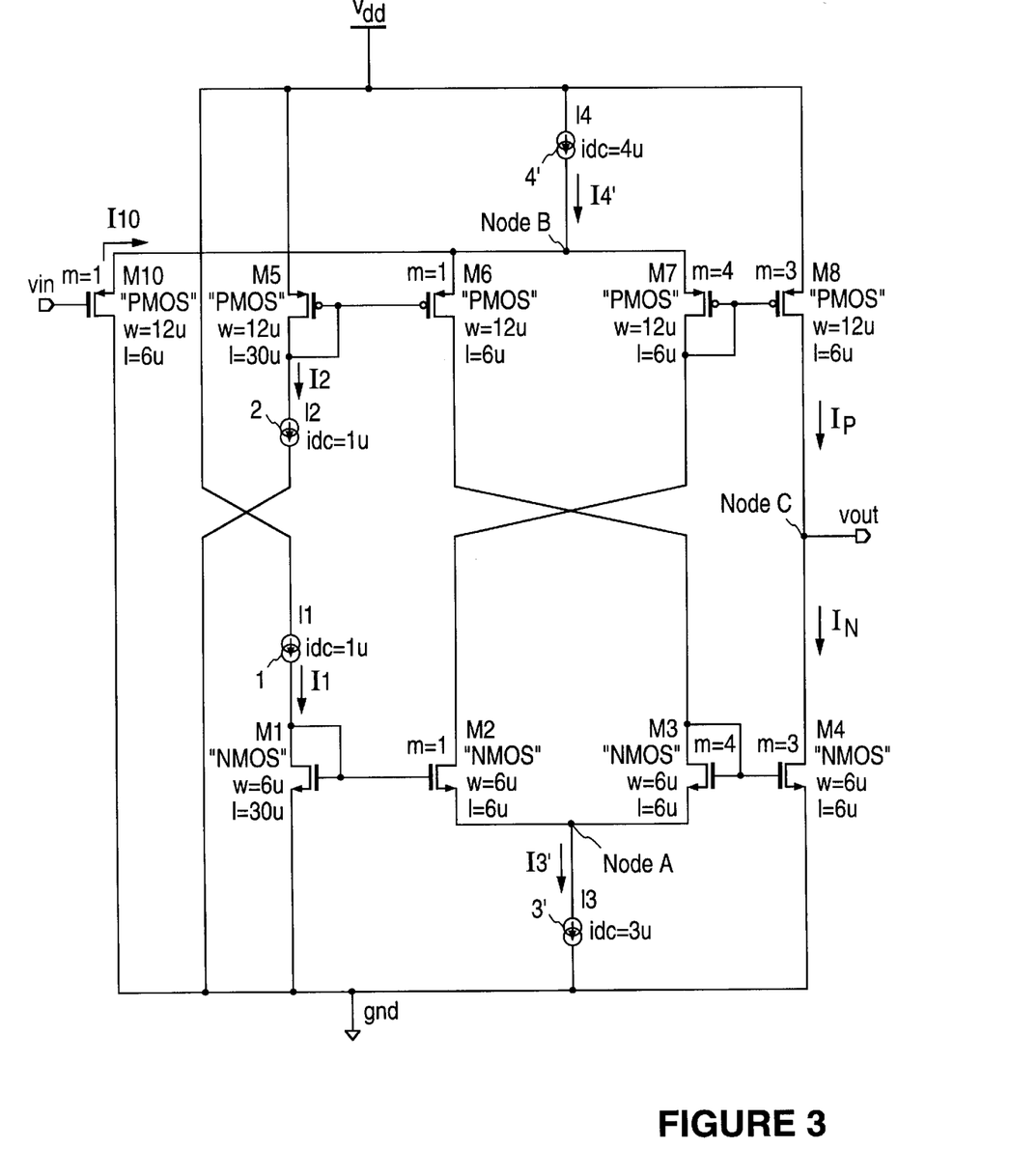
FIG. 3 is a schematic diagram of the CMOS amplifier output stage of FIG. 2 (with a PMOS source follower driving node B thereof rather than an NMOS source follower driving node A as in FIG. 2).

A variation on the FIG. 2 embodiment will next be described with reference to FIG. 3. The CMOS amplifier output stage of FIG. 3 is identical to that of FIG. 2, except in that:

PMOS source follower transistor M10 is provided to drive node B (of FIG. 3) with input current I10 (which is determined by input voltage Vin asserted to the gate of M10) in place of NMOS source follower transistor M9 of FIG. 2; and current source 3' of FIG. 3 sinks bias current I3' from node A of FIG. 3 (in place of current source 3 of FIG. 2) and current source 4' of FIG. 3 is a source of bias current I4' to node B of FIG. 3 (in place of current source 4 of FIG. 2).

In order to properly bias PMOS source follower transistor M10, currents I3' and I4' are 3 microamps and 4 microamps, respectively (in contrast with currents I3 and I4 of FIG. 2 which are 4 microamps and 3 microamps, respectively).

The components of the FIG. 3 embodiment that are identical to those of FIG. 2 are identically numbered in both Figures and the foregoing description thereof will not be repeated with reference to FIG. 3.

In response to a change in input voltage Vin which increases current I10, the voltage at node B falls and thus the voltage at the gate of PMOS output transistor M8 decreases. Thus, more output current $I_P$ can flow through the channel of transistor M8. Also, transistor M6 turns off (if the voltage decrease at Node B is sufficiently great) and the voltage at the gate of NMOS output transistor M4 decreases so that less output current $I_N$ can flow through the channel of transistor M4. Thus, the output voltage Vout at Node C rises and the FIG. 3 circuit can source more output current to Node C.

In response to a change in input voltage Vin which decreases current I10, the voltage at node B rises and thus the voltage at the gate of PMOS output transistor M8 increases. Thus, less output current $I_P$ can flow through the channel of transistor M8. Also, transistor M6 turns on harder and the voltage at the gate of NMOS output transistor M4 increases so that more output current $I_N$ can flow through the channel of transistor M4. Thus, the output voltage Vout at Node C falls and the FIG. 3 circuit can sink more output current from Node C (e.g., from an external circuit or device coupled to Node C).

The output stage of FIG. 3 produces an output voltage Vout at Node C in response to an input voltage Vin at the gate of source follower M10, and includes a complementary output MOSFET transistor pair (transistors M4 and M8) whose channels are connected together in series with channel terminals connected between a supply voltage and a reference potential (ground potential), and whose gates are driven by a complementary MOSFET level shifting transistor pair (diode-connected NMOS transistor M3 and diode-connected PMOS transistor M7) and bias voltage and current circuitry (comprising transistors M1, M2, M5, M6, and M10 and current sources 1, 2, 3', and 4'). Source follower transistor M10 drives the source of diode-connected transistor M7 with current I10 (which current is determined by input voltage Vin as well as by the supply voltage and the characteristics of transistor M10).

Figure 4:
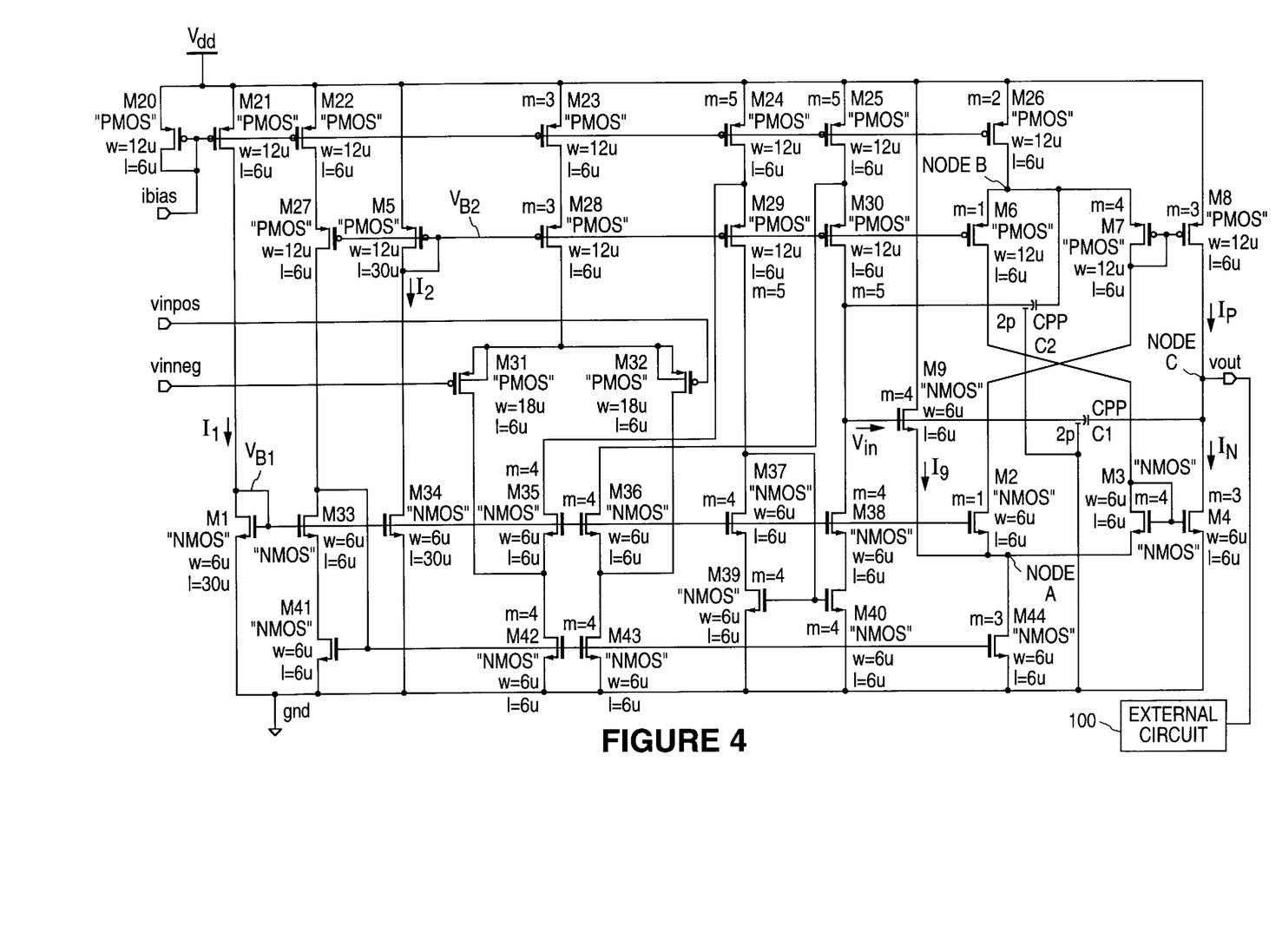
FIG. 4 is a schematic diagram of a complete amplifier circuit which can be implemented as an integrated circuit (or a portion of an integrated circuit) and which includes the FIG. 2 embodiment of the inventive CMOS amplifier output stage.

FIG. 4 is a schematic diagram of a complete amplifier circuit which can be implemented as an integrated circuit (or a portion of an integrated circuit) and which includes the FIG. 2 embodiment of the inventive CMOS amplifier output stage. The amplifier circuit of FIG. 4 has an external circuit 100 coupled to Node C thereof (the term "external circuit" is used in the claims and with reference to element 100 in a broad sense denoting either a circuit or a device). When the amplifier of FIG. 4 is implemented as an integrated circuit, the inventor contemplates that the integrated circuit will have an output pin at Node C and that circuit 100 will be connected to the output pin (external to the integrated circuit), so that current can be sourced to circuit 100 from Node C (or current can be sunk from circuit 100 through Node C and transistor M4 to ground) while the output pin asserts output voltage Vout to circuit 100.

The components of FIG. 4 embodiment that are identical to those of FIG. 2 are identically numbered in both FIGS. 2 and 4 and the foregoing description thereof will not be repeated with reference to FIG. 4. When the amplifier of FIG. 4 is implemented as an integrated circuit, input pins thereof receive input voltages "Vinpos" and "Vinneg" and bias current "Ibias" as shown, and output voltage "Vout" is asserted at an output pin thereof as shown. PMOS transistors M20–M32 and NMOS transistors M33–M44, connected as shown, implement current sources 1, 2, 3, and 4 (shown in FIG. 2) and also implement buffer circuitry for asserting input voltage Vin to the gate of transistor M9 in response to input voltages Vinpos and Vinneg.

It should be understood that various alternatives to the structures described herein may be employed in practicing the present invention. For example, instead of source follower M9 as in FIG. 2 (or source follower M10 as in FIG. 10), the inventive output stage could alternatively be driven by a high impedance such as the drain of a common source or common gate stage. For another example, circuit 100 of FIG. 4 and the other elements of FIG. 4 can be implemented as a single integrated circuit (or a portion of an integrated circuit). It is intended that the following claims define the invention and that structures within the scope of these claims and their equivalents be covered thereby.

What is claimed is:

1. A CMOS amplifier output stage which produces an output voltage in response to an input voltage, comprising:

a complementary MOSFET output transistor pair having channels connected together at an output node, channel terminals for connection between a first node at a supply voltage and a second node at a reference potential, and gates;

a complementary MOSFET level shifting transistor pair having gates connected to the gates of the output transistor pair, and having channel terminals; and bias voltage and current circuitry connected to the gates of the output transistor pair and to the channel terminals of the level shifting transistor pair, wherein the bias voltage and current circuitry is configured to receive the input voltage and assert voltages and currents to the gates of the output transistor pair and the channel terminals of the level shifting transistor pair in response to the input voltage, so that the bias voltage and current circuitry and the level shifting transistor pair cause the complementary output transistor pair to assert the output voltage at the output node, wherein all active components of the output transistor pair, the level shifting transistor pair, and the bias voltage and current circuitry are MOSFET transistors, the MOSFET transistors of the bias voltage and current circuitry and the level shifting transistor pair are configured to operate in saturation and not in the triode state during operation of the output stage, and the output stage is configured to require a minimum supply voltage of $V_{GS}+2V_{SAT}$, where $V_{GS}$ is the largest source to gate voltage drop of the MOSFET transistors during operation and $V_{SAT}$ is the largest source to drain voltage drop of the MOSFET transistors during operation of the output stage.

2. The CMOS amplifier output stage of claim 1, wherein the minimum supply voltage is not greater than 1.8 volts.

3. The CMOS amplifier output stage of claim 1, wherein the output node is configured to be coupled to an external circuit, and said CMOS amplifier output stage is configured such that when the external circuit is coupled to the output node, the CMOS amplifier output stage maintains the output node at the output voltage in both a mode in which the external circuit sinks current of any magnitude in a broad range of values from the output node and a mode in which the external circuit sources current of any magnitude in another broad range of values to the output node.

4. The CMOS amplifier output stage of claim 1, wherein said MOSFET transistors have device sizes, the output node is configured to be coupled to an external circuit, and said CMOS amplifier output stage is configured such that when the external circuit is coupled to the output node the CMOS amplifier output stage has an output quiescent current at the output node, and the output quiescent current is determined by the device sizes of said MOSFET transistors.

5. The CMOS amplifier output stage of claim 1, wherein said CMOS amplifier output stage is an integrated circuit.

6. The CMOS amplifier output stage of claim 1, wherein said CMOS amplifier output stage is a portion of an integrated circuit.

7. A CMOS amplifier output stage which produces an output voltage in response to an input voltage, comprising:

a complementary MOSFET output transistor pair having channels connected together at an output node, channel terminals for connection between a first node at a supply voltage and a second node at a reference potential, and gates;

a complementary MOSFET level shifting transistor pair having gates connected to the gates of the output transistor pair, and having channel terminals; and bias voltage and current circuitry connected to the gates of the output transistor pair and to the channel terminals of the level shifting transistor pair, wherein the bias voltage and current circuitry is configured to receive the input voltage and assert voltages and currents to the sates of the output transistor pair and the channel terminals of the level shifting transistor pair in response to the input voltage, so that the bias voltage and current circuitry and the level shifting transistor pair cause the complementary output transistor pair to assert the output voltage at the output node, wherein all active components of the output transistor pair, the level shifting transistor pair, and the bias voltage and current circuitry are MOSFET transistors, and the output stage requires a minimum supply voltage of $V_{GS}+2V_{SAT}$, where $V_{GS}$ is the largest source to gate voltage drop of the MOSFET transistors during operation and $V_{SAT}$ is the largest source to drain voltage drop of the MOSFET transistors during operation, and wherein the level shifting transistor pair comprises a diode-connected NMOS transistor and a diode-connected PMOS transistor, and the bias voltage and current circuitry includes a source follower transistor having a gate coupled to receive the input voltage.

8. A CMOS amplifier output stage which produces an output voltage in response to an input voltage, comprising:

a complementary MOSFET output transistor pair having channels connected together at an output node, channel terminals for connection between a first node at a supply voltage and a second node at a reference potential and gates;

a complementary MOSFET level shifting transistor pair having gates connected to the gates of the output transistor pair, and having channel terminals; and bias voltage and current circuitry connected to the gates of the output transistor pair and to the channel terminals of the level shifting transistor pair, wherein the bias voltage and current circuitry is configured to receive the input voltage and assert voltages and currents to the gates of the output transistor pair and the channel terminals of the level shifting transistor pair in response to the input voltage, so that the bias voltage and current circuitry and the level shifting transistor pair cause the complementary output transistor pair to assert the output voltage at the output node, wherein all active components of the output transistor pair, the level shifting transistor pair, and the bias voltage and current circuitry are MOSFET transistors, and the output stage requires a minimum supply voltage of $V_{GS}+2V_{SAT}$, where $V_{GS}$ is the largest source to gate voltage drop of the MOSFET transistors during operation and $V_{SAT}$ is the largest source to drain voltage drop of the MOSFET transistors during operation, wherein the level shifting transistor pair comprises a first diode-connected PMOS transistor and a first diode-connected NMOS transistor, and wherein the bias voltage and current circuitry includes:
 a second diode-connected NMOS transistor having a source connected to the second node and a drain;
 a current source connected to the drain of the second diode-connected NMOS transistor;
 a second diode-connected PMOS transistor having a source connected to the first node and a drain;
 a current sink connected to the drain of the second diode-connected PMOS transistor;
 a second current source connected between the second node and a third node;
 a third current source connected between the first node and a fourth node;
 a third PMOS transistor having a source connected to the fourth node, a gate connected to the drain of the second diode-connected PMOS transistor, and a drain; and
 a third NMOS transistor having a source connected to the third node, a gate connected to the drain of the second diode-connected NMOS transistor, and a drain,
 wherein the first diode-connected PMOS transistor has a source connected to the fourth node and a drain connected to the drain of the third NMOS transistor, and the first diode-connected NMOS transistor has a source connected to the third node and a drain connected to the drain of the third PMOS transistor.

9. The CMOS amplifier output stage of claim 8, wherein the bias voltage and current circuitry also includes:
 a source follower NMOS transistor having a source coupled to the third node, a drain coupled to the first node, and a gate coupled to receive the input voltage.

10. The CMOS amplifier output stage of claim 8, wherein the bias voltage and current circuitry also includes:
 a source follower PMOS transistor having a source coupled to the fourth node, a drain coupled to the second node, and a gate coupled to receive the input voltage.

11. A CMOS amplifier output stage which produces an output voltage in response to an input voltage, comprising:
 a complementary MOSFET output transistor pair having channels connected together at an output node at which the output voltage is asserted, channel terminals for connection between a first node at a supply voltage and a second node at a reference potential, and gates;
 a complementary MOSFET level shifting transistor pair having gates connected to the gates of the output transistor pair, wherein the level shifting transistor pair comprises a first diode-connected PMOS transistor and a first diode-connected NMOS transistor; and bias voltage and current circuitry connected to the gates of the output transistor pair, wherein the bias voltage and current circuitry includes:
 a second diode-connected NMOS transistor having a source connected to the reference potential, a drain, and a gate connected to the drain;
 a current source connected to the drain of the second diode-connected NMOS transistor;
 a second diode-connected PMOS transistor having a source connected to the first node, a drain, and a gate connected to the drain;
 a current sink connected to the drain of the second diode-connected PMOS transistor;
 a second current source connected between the second node and a third node;
 a third current source connected between the first node and a fourth node;
 a third PMOS transistor having a source connected to the fourth node, a gate connected to the drain of the second diode-connected PMOS transistor, and a drain;
 a third NMOS transistor having a source connected to the third node, a gate connected to the drain of the second diode-connected NMOS transistor, and a drain; and
 an element coupled to receive the input voltage and configured to assert a signal indicative of the input voltage to one of the third node and the fourth node,
 wherein the first diode-connected PMOS transistor has a source connected to the fourth node, a drain connected to the drain of the third NMOS transistor, and a gate connected to a first one of the gates of the output transistor pair, and
 wherein the first diode-connected NMOS transistor has a source connected to the third node, a drain connected to the drain of the third PMOS transistor, and a gate connected to a second one of the gates of the output transistor pair.

12. The CMOS amplifier output stage of claim 11, wherein all active components of the output transistor pair, the level shifting transistor pair, and the bias voltage and current circuitry are MOSFET transistors, and the output stage requires a minimum supply voltage of $V_{GS}+2V_{SAT}$, where $V_{GS}$ is the largest source to gate voltage drop of the MOSFET transistors during operation and $V_{SAT}$ is the largest source to drain voltage drop of the MOSFET transistors during operation.

13. The CMOS amplifier output stage of claim 11, wherein the minimum supply voltage is not greater than 1.8 volts.

14. The CMOS amplifier output stage of claim 11, wherein said element is a source follower NMOS transistor having a source coupled to the third node, a drain coupled to the first node, and a gate coupled to receive the input voltage.

15. The CMOS amplifier output stage of claim 11, wherein said element is a source follower PMOS transistor having a source coupled to the fourth node, a drain coupled to the second node, and a gate coupled to receive the input voltage.

16. A CMOS amplifier output stage which produces an output voltage in response to an input voltage, comprising:
 a complementary MOSFET output transistor pair having channels connected together at an output node, channel terminals for connection between a first node at a supply voltage and a second node at a reference potential, and gates;

a complementary MOSFET level shifting transistor pair having gates connected to the gates of the output transistor pair, and having channel terminals; and bias voltage and current circuitry connected to the gates of the output transistor pair and to the channel terminals of the level shifting transistor pair, wherein the bias voltage and current circuitry is configured to receive the input voltage and assert voltages and currents to the gates of the output transistor pair and the channel terminals of the level shifting transistor pair in response to the input voltage, so that the bias voltage and current circuitry and the level shifting transistor pair cause the complementary output transistor pair to assert the output voltage at the output node, wherein all active components of the output transistor pair, the level shifting transistor pair, and the bias voltage and current circuitry are MOSFET transistors, the MOSFET transistors of the bias voltage and current circuitry and the level shifting transistor pair are configured to operate in saturation and not in the triode state during operation of the output stage, and the output stage is configured to require a minimum supply voltage not greater than 1.8 volts.

17. The CMOS amplifier output stage of claim 16, wherein the output node is configured to be coupled to an external circuit, and said CMOS amplifier output stage is configured such that when the external circuit is coupled to the output node, the CMOS amplifier output stage maintains the output node at the output voltage in both a mode in which the external circuit sinks current of any magnitude in a broad range of values from the output node and a mode in which the external circuit sources current of any magnitude in another broad range of values to the output node.

18. The CMOS amplifier output stage of claim 16, wherein said CMOS amplifier output stage is an integrated circuit.

19. The CMOS amplifier output stage of claim 16, wherein said CMOS amplifier output stage is a portion of an integrated circuit.

20. A CMOS amplifier output stage which produces an output voltage in response to an input voltage, comprising:

a complementary MOSFET output transistor pair having channels connected together at an output node, channel terminals for connection between a first node at a supply voltage and a second node at a reference potential, and gates;

a complementary MOSFET level shifting transistor pair having gates connected to the gates of the output transistor pair, and having channel terminals; and bias voltage and current circuitry connected to the gates of the output transistor pair and to the channel terminals of the level shifting transistor pair, wherein the bias voltage and current circuitry is configured to receive the input voltage and assert voltages and currents to the gates of the output transistor pair and the channel terminals of the level shifting transistor pair in response to the input voltage, so that the bias voltage and current circuitry and the level shifting transistor pair cause the complementary output transistor pair to assert the output voltage at the output node, wherein all active components of the output transistor pair, the level shifting transistor pair, and the bias voltage and current circuitry are MOSFET transistors, and the output stage requires a minimum supply voltage not greater than 1.8 volts, and wherein the level shifting transistor pair comprises a diode-connected NMOS transistor and a diode-connected PMOS transistor, and the bias voltage and current circuitry includes a source follower transistor having a gate coupled to receive the input voltage.

21. A CMOS amplifier output stage which produces an output voltage in response to an input voltage, comprising:

a complementary MOSFET output transistor pair having channels connected together at an output node, channel terminals for connection between a first node at a supply voltage and a second node at a reference potential, and gates;

a complementary MOSFET level shifting transistor pair having gates connected to the gates of the output transistor pair, and having channel terminals; and bias voltage and current circuitry connected to the gates of the output transistor pair and to the channel terminals of the level shifting transistor pair, wherein the bias voltage and current circuitry is configured to receive the input voltage and assert voltages and currents to the gates of the output transistor pair and the channel terminals of the level shifting transistor pair in response to the input voltage, so that the bias voltage and current circuitry and the level shifting transistor pair cause the complementary output transistor pair to assert the output voltage at the output node, wherein all active components of the output transistor pair, the level shifting transistor pair, and the bias voltage and current circuitry are MOSFET transistors, and the output stage requires a minimum supply voltage not greater than 1.8 volts, wherein the level shifting transistor pair comprises a first diode-connected PMOS transistor and a first diode-connected NMOS transistor, and wherein the bias voltage and current circuitry includes:

a second diode-connected NMOS transistor having a source connected to the reference potential and a drain;

a current source connected to the drain of the second diode-connected NMOS transistor;

a second diode-connected PMOS transistor having a source connected to the first node and a drain;

a current sink connected to the drain of the second diode-connected PMOS transistor;

a second current source connected between the second node and a third node;

a third current source connected between the first node and a fourth node;

a third PMOS transistor having a source connected to the fourth node, a gate connected to the drain of the second diode-connected PMOS transistor, and a drain; and a third NMOS transistor having a source connected to the third node, a gate connected to the drain of the second diode-connected NMOS transistor, and a drain, wherein the first diode-connected PMOS transistor has a source connected to the fourth node and a drain connected to the drain of the third NMOS transistor, and the first diode-connected NMOS transistor has a source connected to the third node and a drain connected to the drain of the third PMOS transistor.

* * * * *

UNITED STATES PATENT AND TRADEMARK OFFICE
CERTIFICATE OF CORRECTION

PATENT NO.: 5,847,606
DATED: December 8, 1998
INVENTOR(S): Stuart Barnett Shacter It is certified that errors appear in the above-identified patent and that said Letters Patent is hereby corrected as shown below:

In Col. 8, line 37, delete "sates" and replace with --gates--.

In Col. 8, line 62, before "and gates;" insert --,--.

Signed and Sealed this

Ninth Day of March, 1999

Attest:

Q. TODD DICKINSON

Attesting Officer

Acting Commissioner of Patents and Trademarks